(12) United States Patent
Ishihara et al.

(10) Patent No.: US 11,754,775 B2
(45) Date of Patent: Sep. 12, 2023

(54) LIGHT EMITTING DEVICE AND LIGHT GUIDING MEMBER

(71) Applicant: CANON KABUSHIKI KAISHA, Tokyo (JP)

(72) Inventors: Kazuto Ishihara, Kanagawa (JP); Yasuhito Tsubakimoto, Tokyo (JP); Gakushi Tanaka, Kanagawa (JP); Akira Nakashima, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/931,866

(22) Filed: Sep. 13, 2022

(65) Prior Publication Data

US 2023/0078594 A1    Mar. 16, 2023

(30) Foreign Application Priority Data

Sep. 15, 2021   (JP) .................................. 2021-150416

(51) Int. Cl.
| | |
|---|---|
| *F21V 8/00* | (2006.01) |
| *B41J 29/38* | (2006.01) |
| *H04N 1/00* | (2006.01) |
| *H01L 25/075* | (2006.01) |

(52) U.S. Cl.
CPC ............ *G02B 6/0091* (2013.01); *B41J 29/38* (2013.01); *G02B 6/0068* (2013.01); *H01L 25/0753* (2013.01); *H04N 1/0049* (2013.01); *H04N 1/00477* (2013.01)

(58) Field of Classification Search
CPC ...... G02B 6/0091; G02B 6/0068; B41J 29/38; H01L 25/0753; H04N 1/00477; H04N 1/0049
See application file for complete search history.

(56) References Cited

U.S. PATENT DOCUMENTS

| | | | |
|---|---|---|---|
| 7,213,914 B2 * | 5/2007 | Anma ................... | B41J 2/17546 347/86 |
| 8,136,930 B2 * | 3/2012 | Anma ................... | B41J 2/17546 347/49 |
| 9,277,082 B2 * | 3/2016 | Sugiyama .............. | H04N 1/488 |

(Continued)

FOREIGN PATENT DOCUMENTS

| | | |
|---|---|---|
| JP | 2004-047358 A | 2/2004 |
| JP | 2009-223196 A | 10/2009 |
| JP | 2021-027018 A | 2/2021 |

*Primary Examiner* — Mary Ellen Bowman
(74) *Attorney, Agent, or Firm* — Canon U.S.A., Inc. I.P. Division

(57) ABSTRACT

A light emitting device includes first and second light emitting elements; and a light guiding member including first and second light receiving portion corresponding to the first and second light emitting elements and configured to emit the light received by the first and second light receiving portions from a light emitting portion via a light guiding portion. The light guiding portion includes a reflecting surface forming portion between the first light receiving portion and the second light receiving portion in the first direction. The reflecting surface forming portion includes first and second reflecting surfaces. The first reflecting surface is formed by surfaces having different angles including a surface that reflects the light from the first light receiving portion to a side of the first light receiving portion.

21 Claims, 11 Drawing Sheets

(56) References Cited

U.S. PATENT DOCUMENTS

| | | | | |
|---|---|---|---|---|
| 2005/0185034 A1* | 8/2005 | Anma | ............... | B41J 2/17546 |
| | | | | 347/86 |
| 2009/0015886 A1* | 1/2009 | Kim | ............... | H04N 1/02885 |
| | | | | 358/484 |
| 2012/0170310 A1* | 7/2012 | Bita | ................ | G02B 6/0065 |
| | | | | 362/613 |
| 2013/0278846 A1* | 10/2013 | Holman | ............ | G02B 26/0841 |
| | | | | 359/290 |
| 2020/0254771 A1* | 8/2020 | Netsu | ............... | G01F 23/2927 |

* cited by examiner

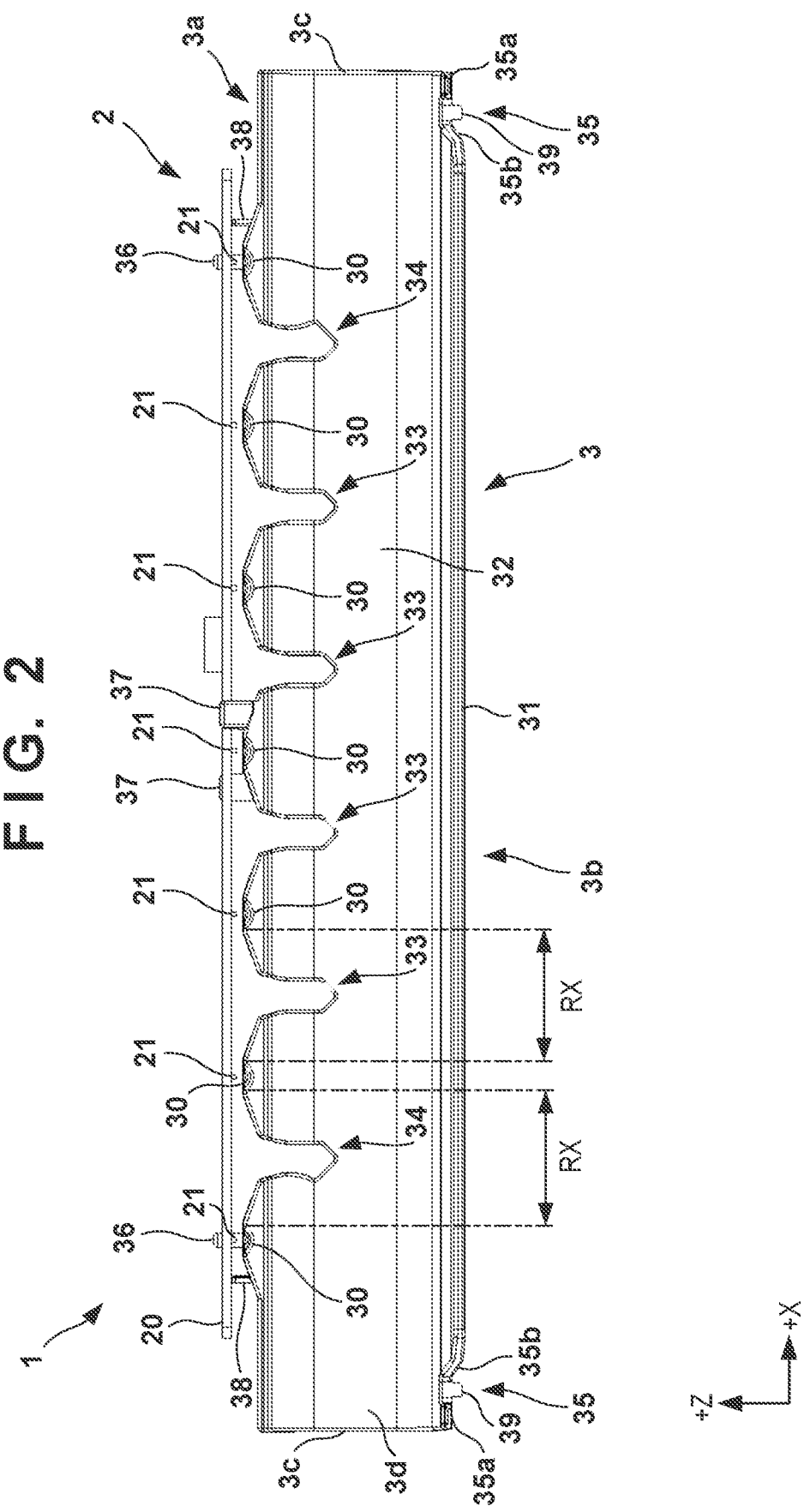

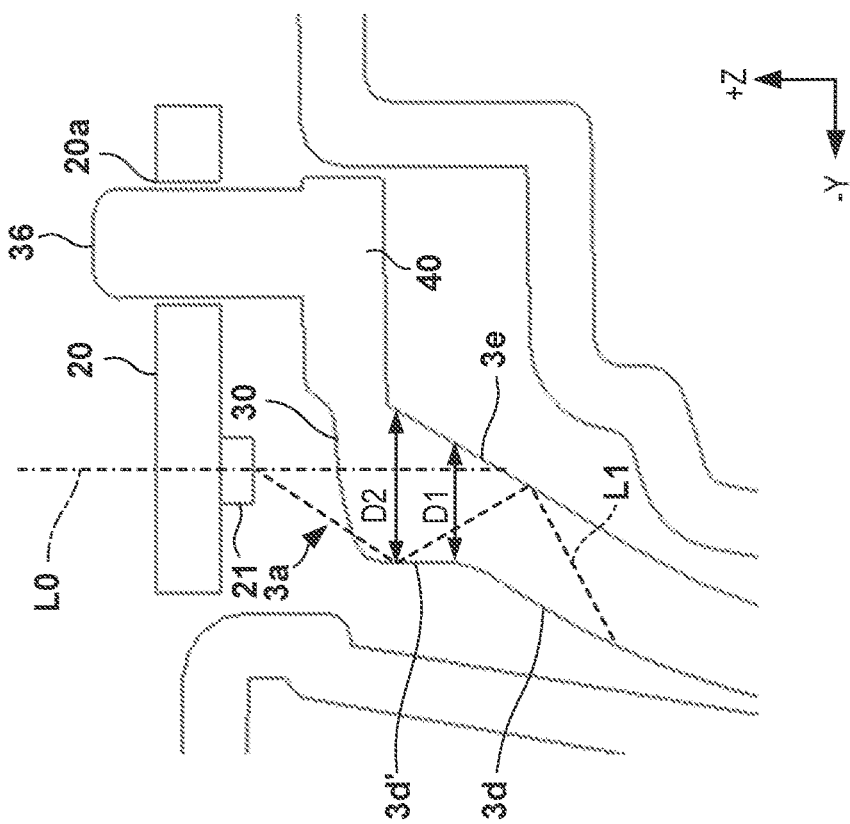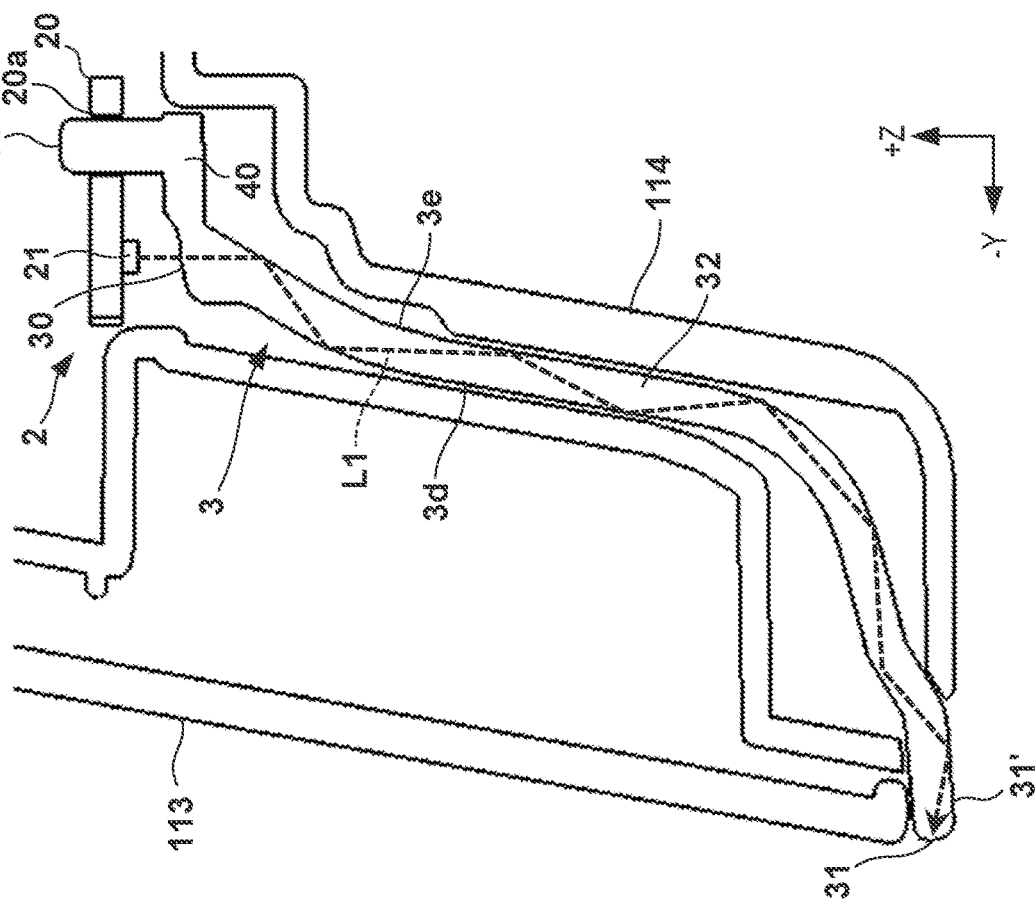

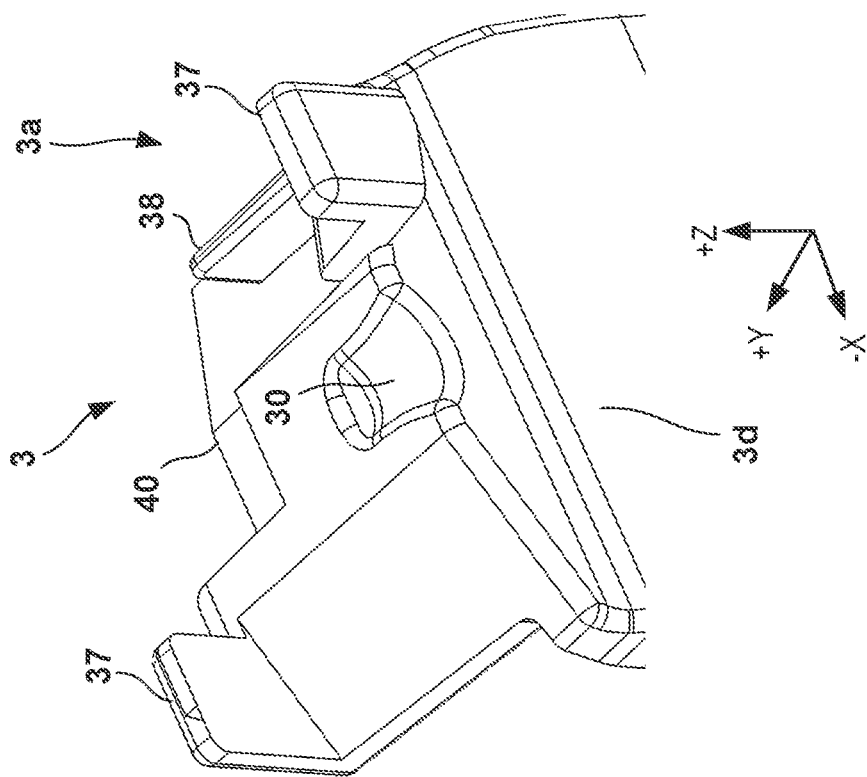
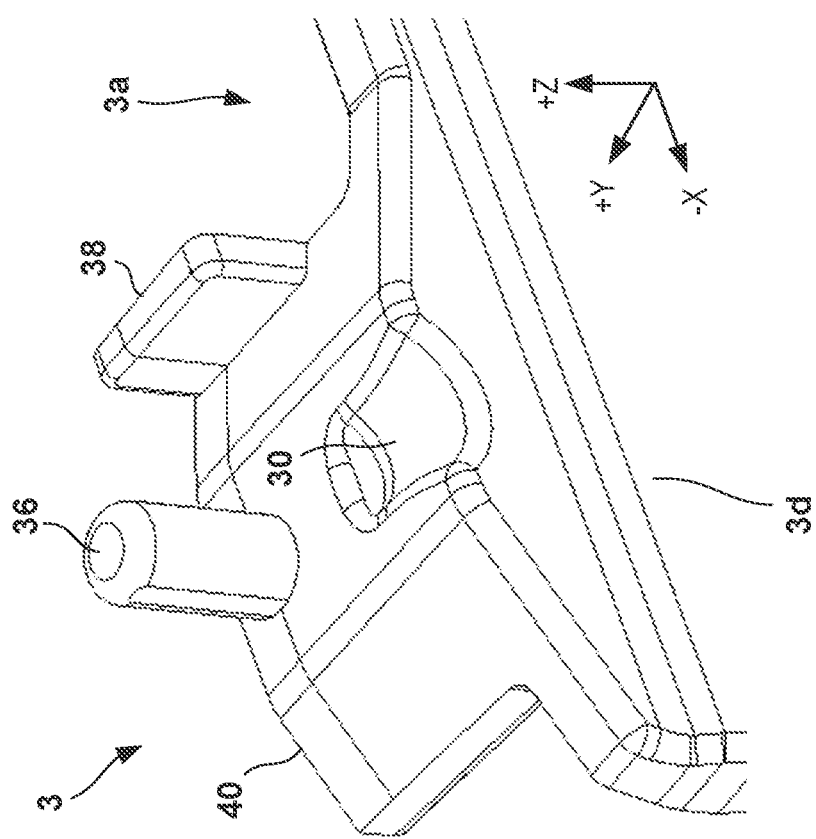

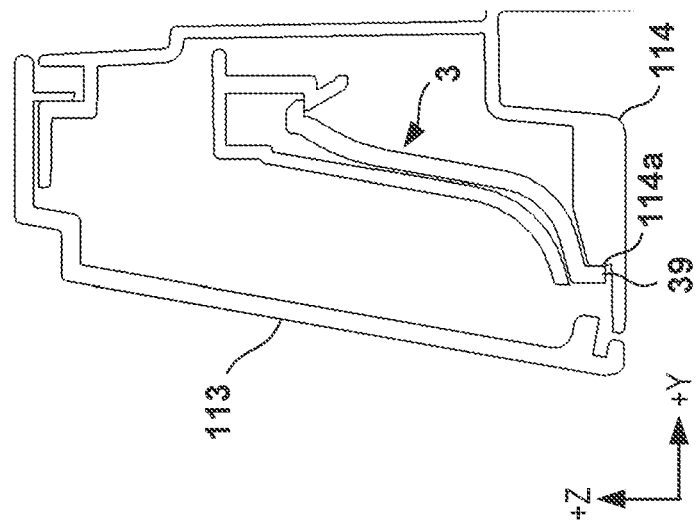
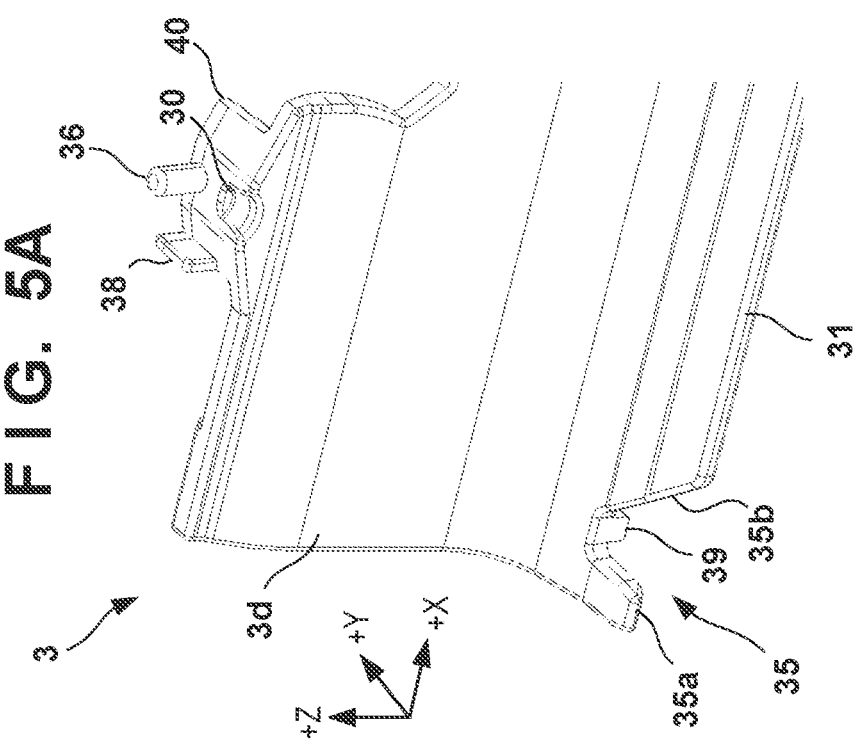

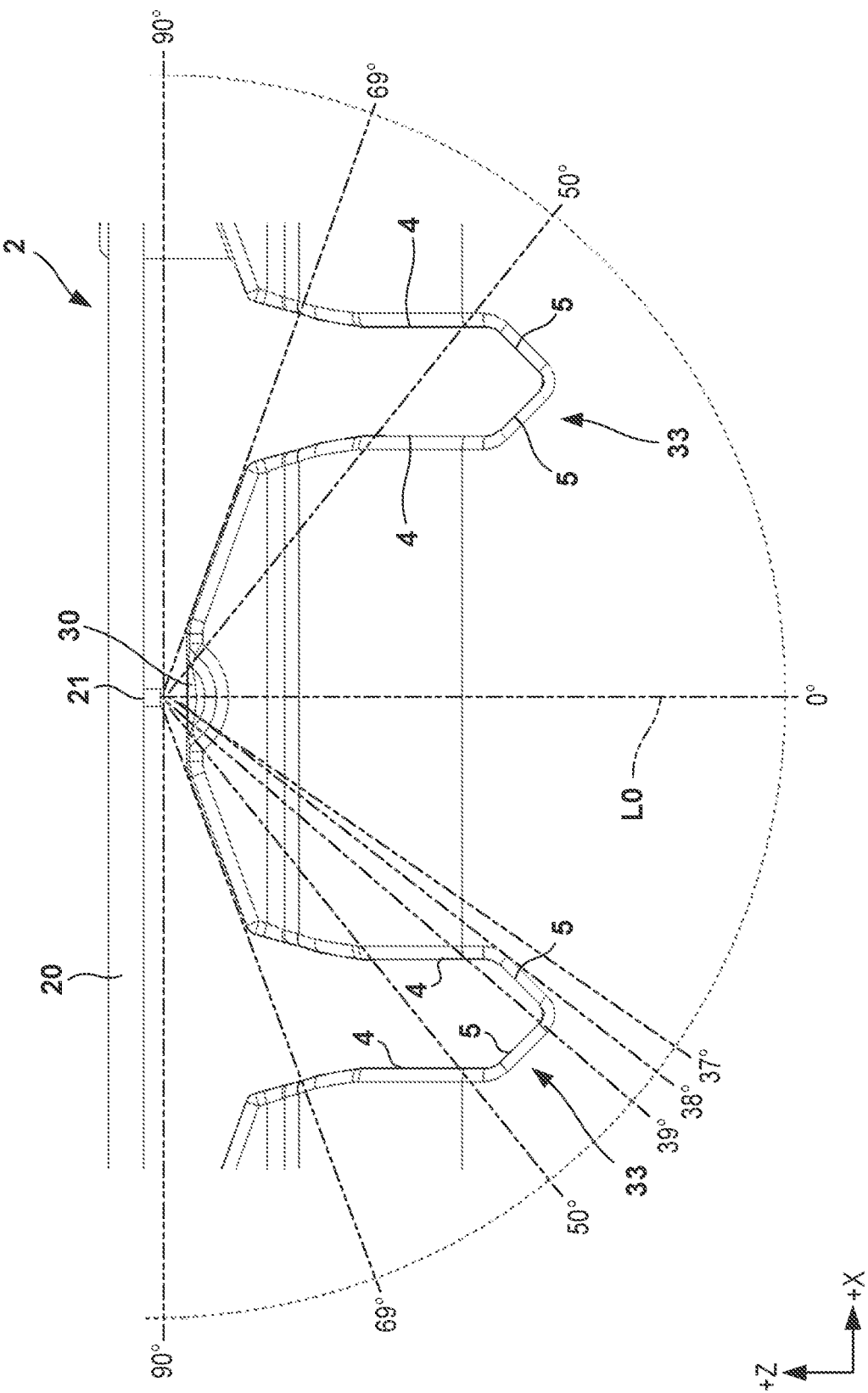

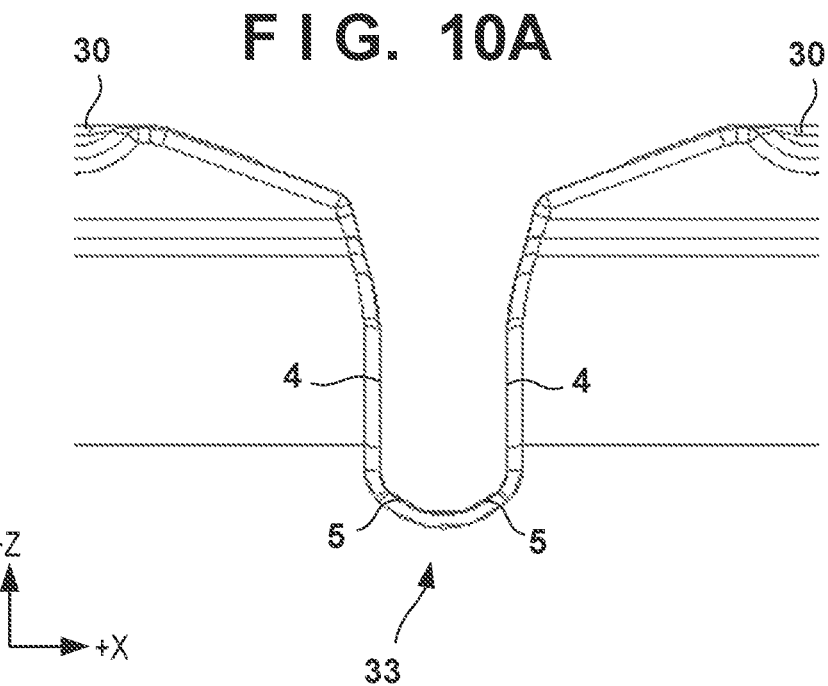
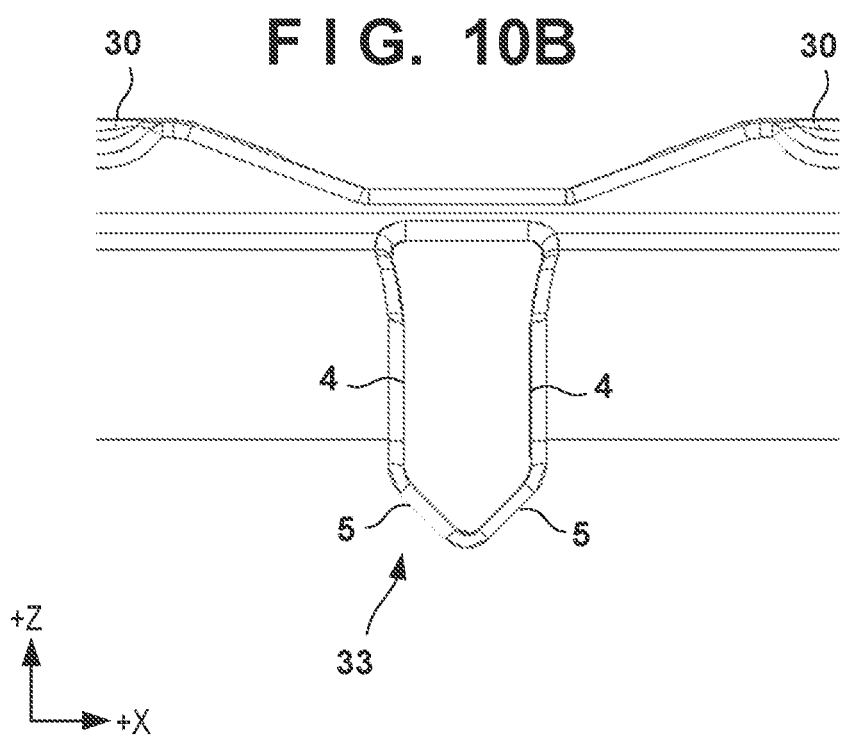

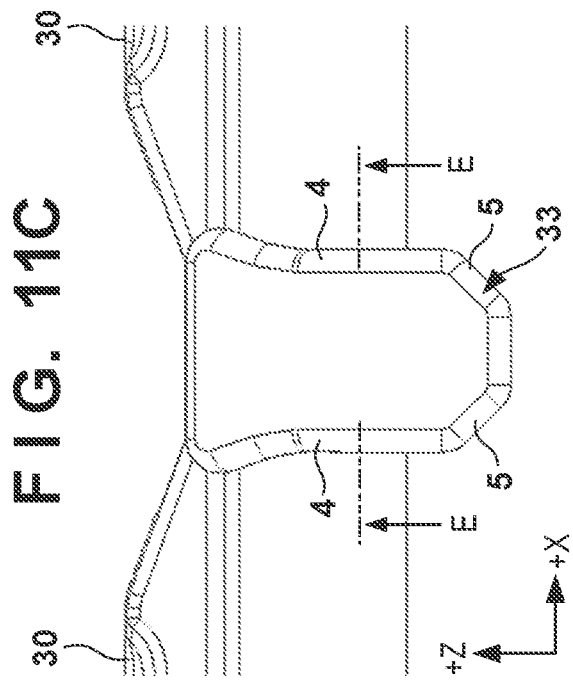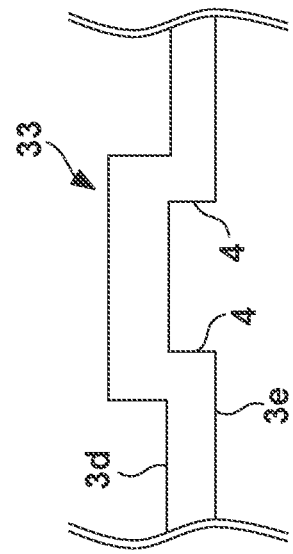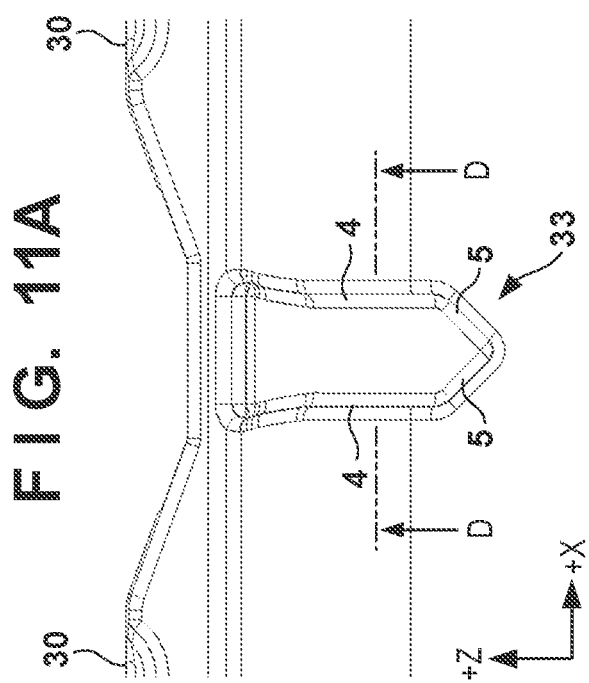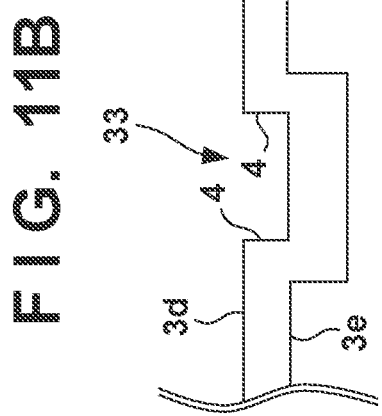

LIGHT EMITTING DEVICE AND LIGHT GUIDING MEMBER

BACKGROUND

Field of the Disclosure

The present disclosure relates to a light emitting device and a light guiding member.

Description of the Related Art

A display device that emits light by guiding light from a light source using a light guiding member has been proposed. Japanese Patent Laid-Open No. 2009-223196 discloses a technique in which a light guiding member is provided with a triangular concave portion which reflects light from a single light source, thereby improving the uniformity of luminance in a light emitting portion. Japanese Patent Laid-Open No. 2021-27018 discloses a technique in which a light guiding member is provided with a reflecting surface in a protrusion shape which reflects light beams from a plurality of light sources arranged in a row, thereby improving the uniformity of luminance in a light emitting portion.

In a configuration in which a plurality of light sources are provided in a row, it may be dark at a place far from the light source, and so luminance unevenness may occur in a light emitting portion.

SUMMARY

The present disclosure provides a technique of, in a configuration in which light beams from a plurality of light sources are guided to a light emitting portion, reducing luminance unevenness in the light emitting portion.

According to an aspect of the present disclosure, there is provided a light emitting device comprising: a first light emitting element; a second light emitting element arranged spaced apart from the first light emitting element in a first direction; and a light guiding member including a first light receiving portion configured to receive light from the first light emitting element and a second light receiving portion configured to receive light from the second light emitting element, and configured to emit the light received by the first light receiving portion and the second light receiving portion from a light emitting portion via a light guiding portion, wherein the light guiding portion includes a reflecting surface forming portion between the first light receiving portion and the second light receiving portion in the first direction, and the reflecting surface forming portion includes a first reflecting surface formed by surfaces having different angles including a surface that reflects the light from the first light receiving portion to a side of the first light receiving portion, and a second reflecting surface formed by surfaces having different angles including a surface that reflects the light from a side of the second light receiving portion to the side of the second light receiving portion.

Further features of the present disclosure will become apparent from the following description of exemplary embodiments (with reference to the attached drawings).

BRIEF DESCRIPTION OF THE DRAWINGS

FIG. 2 is a view for explaining a light emitting device according to an embodiment of the present disclosure;

FIG. 3A is a sectional view taken along a line A-A in FIG. 1A,

FIG. 3B is a partially enlarged view of FIG. 3A;

FIGS. 4A and 4B are perspective views each showing a part of a light guiding member;

FIG. 5A is a perspective view showing a part of the light guiding member;

FIG. 5B is a sectional view taken along a line B-B in FIG. 1A;

FIG. 7 is a view for explaining reflecting surfaces;

FIGS. 10A and 10B are views each for explaining still another embodiment; and

FIGS. 11A to 11D are views for explaining still another embodiment.

DESCRIPTION OF THE EMBODIMENTS

Figure 1A:
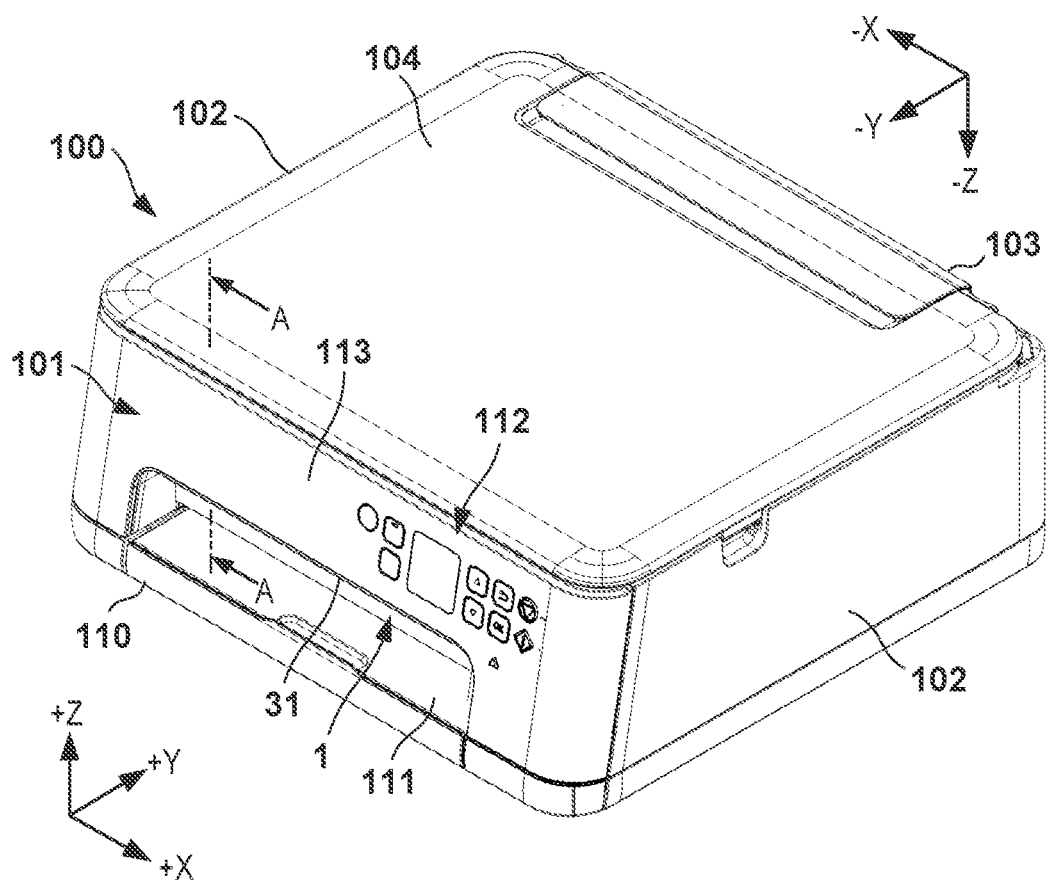
FIG. 1A is an external view of a printing apparatus as an application example of the present disclosure.

Hereinafter, embodiments will be described in detail with reference to the attached drawings. Note, the following embodiments are not intended to limit the scope of the disclosure. Multiple features are described in the embodiments, but limitation is not made which requires all such features, and multiple such features may be combined as appropriate. Furthermore, in the attached drawings, the same reference numerals are given to the same or similar configurations, and redundant description thereof is omitted.

First Embodiment

<Printing Apparatus>

FIG. 1A is a schematic view of a printing apparatus 100 to which a display device 1 according to an embodiment of the present disclosure is applied. Note that in each drawing, an arrow X and an arrow Y indicate horizontal directions orthogonal to each other, and an arrow Z indicates a vertical direction. For the printing apparatus 100 of this embodiment, the widthwise direction (or left-right direction) is the X direction, the depth direction is the Y direction, and the height direction is the Z direction. "+X" and "−X" mean one direction and an opposite direction in the X direction, respectively, "+Y" and "−Y" mean one direction (front-rear direction) and an opposite direction (rear-front direction) in the Y direction, respectively, and "+Z" and "−Z" mean one direction (upward direction) and an opposite direction (downward direction) in the Z direction, respectively.

The printing apparatus 100 includes a front surface 101, left and right side surfaces 102, a rear surface 103, and a top surface 104, and has a rectangular parallelepiped shape as a whole. The printing apparatus 100 is a serial type inkjet printing apparatus. The printing apparatus 100 prints an image by discharging ink to a sheet-like print medium stored in a feeding cassette 110, and discharges the print medium to the front of the apparatus from a discharge port 111 formed in the front surface 101. Note that "printing" includes not only forming significant information such as characters and graphics but also forming images, figures, patterns, and the like on print media in a broad sense, or processing print media, regardless of whether the information formed is significant or insignificant or whether the information formed is visualized so that a human can visually perceive it. In addition, although in this embodiment, sheet-like paper is assumed as a "print medium", cloth, a plastic film, and the like may be used as print media.

An operation unit 112 is provided in the front surface 101, and a user can perform various kinds of settings via the operation unit 112. Further, in the front surface 101, a light emitting portion 31 serving as a display unit of the display device 1, which is a light emitting device, is exposed. The display device 1 is incorporated in the front portion of the printing apparatus 100, and covered by a cover member 113 such that only the light emitting portion 31 is exposed. The cover member 113 is a member forming a housing of the printing apparatus 100, and forms the front surface 101. The light emitting portion 31 continuously extends in a strip shape in the X direction. For example, when the entire light emitting portion 31 emits light, a user can be informed of the state (for example, activation, shut down, normal, or abnormal) of the printing apparatus 1. Further, for example, when the light emitting portion 31 partially emits light, the user can be informed of running out of one of a plurality of kinds of inks accommodated in the printing apparatus 100.

<Display Device (Light Emitting Device)>

Figure 1B:
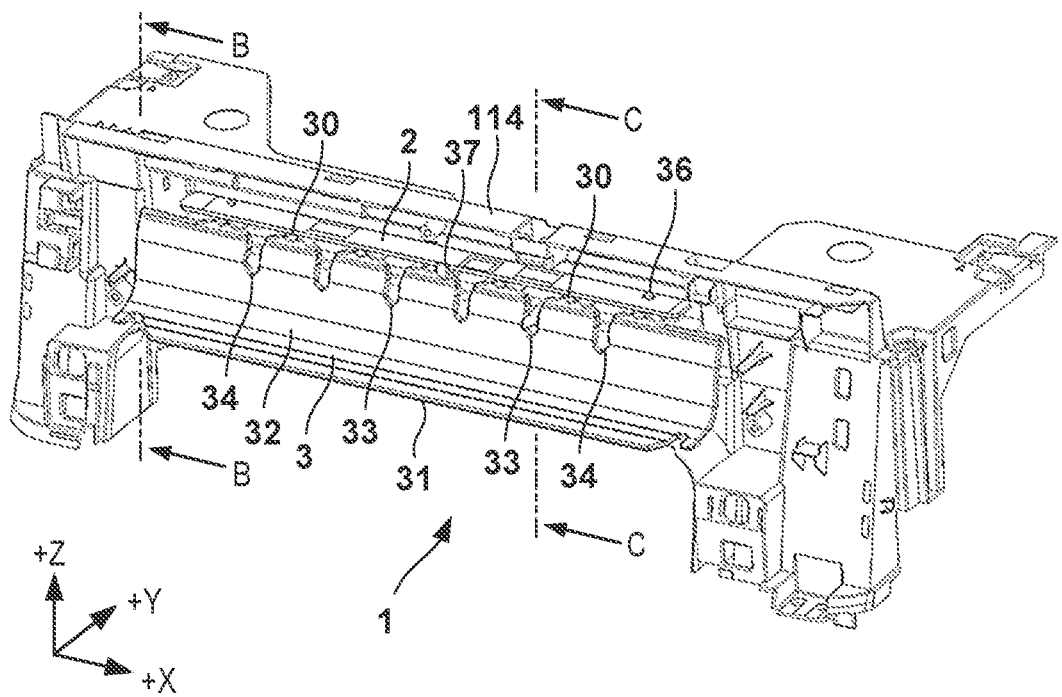
FIG. 1B is a view for explaining the internal structure of the printing apparatus shown in FIG. 1A.

FIG. 1B shows a part of the internal structure of the printing apparatus 100, and particularly shows the structure around the display device 1. FIG. 2 is a view for explaining the basic structure of the display device 1, and corresponds to a front view of the display device 1. FIG. 3A is a sectional view taken along a line A-A in FIG. 1A, and FIG. 3B is a partially enlarged view of FIG. 3A.

The printing apparatus 100 includes a frame 114 that supports internal mechanisms and the like of the printing apparatus 100, and the display device 1 is supported by the frame 114. The display device 1 includes a light emitting element board 2 and a light guiding member 3. The light emitting element board 2 includes a circuit board 20 and a plurality of light emitting elements 21. The circuit board 20 is a flat plate-like rectangular board long in the X direction, and provided with an electric circuit for causing the light emitting elements 21 to emit light. Each light emitting element 21 is a point light source such as an LED, and supported on the lower surface of the circuit board 20. The light emitting elements 21 are arranged in a row while being spaced apart from each other in the X direction. In this embodiment, the light emitting elements 21 are arranged in one row at an equal pitch in the X direction. In this embodiment, seven light emitting elements 21 are provided.

The light guiding member 3 is formed of a transparent resin such as acrylic or polystyrene. The light guiding member 3 includes an upper end portion 3a and a lower end portion 3b spaced apart from each other in the Z direction, left and right side surfaces 3c spaced apart from each other in the X direction, and a front surface 3d on the front side and a rear surface 3e on the rear side spaced apart from each other in the Y direction. The light guiding member 3 is a plate-like member having a moderately bent L-shaped sectional shape on the Y-Z plane as a whole.

A plurality of light receiving portions 30 is formed in the end portion 3a. The light receiving portions 30 are arrayed spaced apart from each other in the X direction so as to correspond to the plurality of light emitting elements 21. Each light receiving portion 30 faces the corresponding light emitting element 21 in the Z direction. The end portion 3b includes end portions 35 spaced apart from each other in the X direction, and a light emitting portion 31 between the end portions 35. The light emitting portion 31 is a surface continuously formed in a strip shape in the X direction. The extending direction of the light emitting portion 31 and the array direction of the plurality of light receiving portions 30 are parallel to each other, and the X-direction position of each light receiving portion 30 is located within the X-direction extending range of the light emitting portion 31.

Alight guiding portion 32 is formed between the end portion 3a and the end portion 3b, that is, between the plurality of light receiving portions 30 and the light emitting portion 31. Light having entered the plurality of light receiving portions 30 propagates in the light guiding portion 32, and exits from the light emitting portion 31. Each of the side surfaces 3c, the front surface 3d, and the rear surface 3e serving as interfaces with air functions as a reflecting surface that reflects the light propagating in the light guiding portion 32. FIG. 3A illustrates a light guiding mode. The light emitted from the light emitting element 21 enters the light guiding member 3 from the light receiving portion 30, and propagates to the light emitting portion 31 while being repeatedly reflected by the front surface 3d and the rear surface 3e as represented by a dashed line L1. Thus, the light emitting portion 31 emits light.

The reflection angle and refraction angle of light reflected by an interface change in accordance with the refractive index determined by the materials inside and outside the interface. Of the light, a light beam entering at a critical angle or less is totally reflected, and the intensity of light is maintained. Assuming that air exists outside the reflecting surface (outside the interface) and the material of the light guiding member 3 is polystyrene, the critical angle is determined to be about 39° by the refractive indices thereof.

Note that as shown in FIG. 3A, a lower end face 31' of the light guiding member 3 adjacent to the light emitting portion 31 may also be a light emitting portion. In this embodiment, the lower end face 31' is made a reflecting surface, thereby improving the luminance of the light emitting portion 31.

As shown in FIG. 3B, in the end portion 3a, the cross sectional area of the light guiding member 3 orthogonal to an optical axis L0 on the optical axis (on the optical axis L0) of the light emitting element 21 in a peripheral portion of the light receiving portion 30 increases as the cross section position approaches the light emitting element 21. In this embodiment, the optical axis L0 extends in the Z direction, and the cross sectional area of the light guiding member 3 orthogonal to the optical axis L0 corresponds to a sectional view of the light guiding member 3 on the X-Y plane. The light guiding member 3 extends from the end portion 3a while inclining to the front side in the lower portion. Each of the front surface 3d and the rear surface 3e is an inclined surface inclined with respect to the Z direction.

However, an upper portion 3d' of the front surface 3d forms a surface parallel to the Z direction. The Y-direction width of the light guiding member 3 is small (width D1) in the lower portion of the upper portion 3d', and large (width D2>width D1) in the upper portion. With this structure, the cross sectional area of the light guiding member 3 orthogonal to the optical axis L0 increases as it approaches the light emitting element 21. As a result, it is possible to receive more light beams radially spreading from the light emitting element 21.

<Engagement Structure>

The engagement structure between the light emitting element board 2 and the light guiding member 3 will be described with reference to FIGS. 2 to 4B. Each of FIGS. 4A and 4B is a perspective view showing the periphery of the light receiving portion 30. FIG. 4A is a perspective view showing the periphery of the light receiving portion 30 located in an end portion (the right end in FIG. 2) in the X direction, and FIG. 4B is a perspective view showing the periphery of the light receiving portion 30 located in a central portion in the X direction.

A plurality of pedestal portions 40 for mounting the circuit board 20 on the end portion 3a are formed in the light guiding member 3. The pedestal portion 40 is formed for each light receiving portion 30, and extends in the Y direction. Each light receiving portion 30 has a concave shape recessed downward in the Z direction, and its sectional shape on the X-Z plane is an arcuate shape.

An engagement portion 36 is provided on each of the pedestal portions 40 located in both end portions in the X direction. The engagement portion 36 is a protruding portion extending upward in the Z direction from the pedestal portion 40, and has a column shape. The engagement portion 36 is inserted into an opening portion 20a extending through the circuit board 20 in its thickness direction (Z direction). With this, positioning between the circuit board 20 and the light guiding member 3 in the X direction and the Y direction can be performed. Thus, it is possible to make each light receiving portion 30 and each light emitting element 21 face each other at designed positions (positions in X and Y directions) more reliably while improving the assembly accuracy.

An engagement portion 38 is provided on each of the pedestal portions 40 located in the both end portions in the X direction and the pedestal portion 40 located in the central portion. The engagement portion 38 has a rectangular plate-like shape extending upward from the pedestal portion 40 in the Z direction. The engagement portion 38 is an abutment portion that abuts against the lower surface of the circuit board 20. By using a plurality of the engagement portions 38 spaced apart from each other in the X direction, positioning between the circuit board 20 and the light guiding member 3 in the optical axis L0 direction (Z direction) can be performed. It is also possible to make each light receiving portion 30 and each light emitting element 21 face each other at a designed distance (a distance in the optical axis L0 direction) more reliably while improving the assembly accuracy.

A pair of engagement portions 37 are provided on the pedestal portion 40 located in the central portion in the X direction. The engagement portion 37 has a rectangular plate-like shape extending upward from the pedestal portion 40 in the Z direction. The pair of engagement portions 37 are holding portions arranged spaced apart from each other in the Y direction so as to sandwich the circuit board 20. When the pair of engagement portions 37 sandwich the circuit board 20 in the Y direction, the circuit board 20 can be more reliably prevented from falling off from the light guiding member 3 due to vibration and the like. Further, when the pair of engagement portions 37 sandwich the circuit board 20, a warp of the light guiding member 3 in the Y direction can be corrected.

The engagement portions 36 to 38 are integrally molded with the light guiding member 3 as parts of the light guiding member 3. They can be formed without using a +Z-direction mold slide mechanism, and this is advantageous in terms of part manufacture.

<Positioning Structure with Respect to Frame>

A positioning structure for the light guiding member 3 (particularly, the light emitting portion 31) will be described with reference to FIG. 2 and FIGS. 5A and 5B. An abutment portion 39 protruding downward in the Z direction is formed in each end portion 35 on each side of the light emitting portion 31 in the X direction. FIG. 5A is a perspective view showing the periphery of the abutment portion 39 on the left side in FIG. 2, and FIG. 5B is a sectional view taken along a line B-B in FIG. 1B (a sectional view on the Y-Z plane passing through the abutment portion 39). The abutment portion 39 has a rectangular plate-like shape. A shoulder portion 114a against which the abutment portion 39 abuts is formed in the frame 114. When the abutment portion 39 abuts against the shoulder portion 114a in the Y direction, the light guiding member 3 (particularly, the light emitting portion 31) is positioned in the Y direction. With this, a shift of the light emission position of the light emitting portion 31 can be prevented.

<Reflecting Surface Forming Portion>

FIG. 2 will be referred to. In this embodiment, the plurality of light receiving portions 30 are arrayed spaced apart from each other in the X direction. In general, with the structure as described above, when the light emitting portion 31 emits light, luminance unevenness may occur in the X direction. That is, in the light emitting portion 31, light from the light receiving portion 30 easily gathers to a portion at a position close to the light receiving portion 30 in the X direction, and the luminance is high there. On the other hand, in the light emitting portion 31, light from the light receiving portion 30 does not easily gather to a portion at a position far from the light receiving portion 30 in the X direction, and the luminance tends to decrease there. In this embodiment, reflecting surface forming portions 33 and 34 are formed in the light guiding portion 32 to decrease the X-direction luminance unevenness in the light emitting portion 31.

Regarding the position in the X direction, each of the reflecting surface forming portions 33 and 34 is arranged in a region RX between two light receiving portions 30 adjacent to each other, and it reflects each of light from one light receiving portion 30 and light from the other light receiving portion 30. In this embodiment, each of the reflecting surface forming portions 33 is located in the center of the region RX in the X direction. The reflecting surface forming portion 34 is located roughly in the center of the region RX in the X direction. Regarding the position in the X direction, the reflecting surface forming portion 33 is arranged in the region RX between two light receiving portions 30 which are not located in either end portion in the X direction. Regarding the position in the X direction, the reflecting surface forming portion 34 is arranged in the region RX between the light receiving portion 30 located in the end portion in the X direction and the light receiving portion 30 adjacent thereto.

Figure 6:
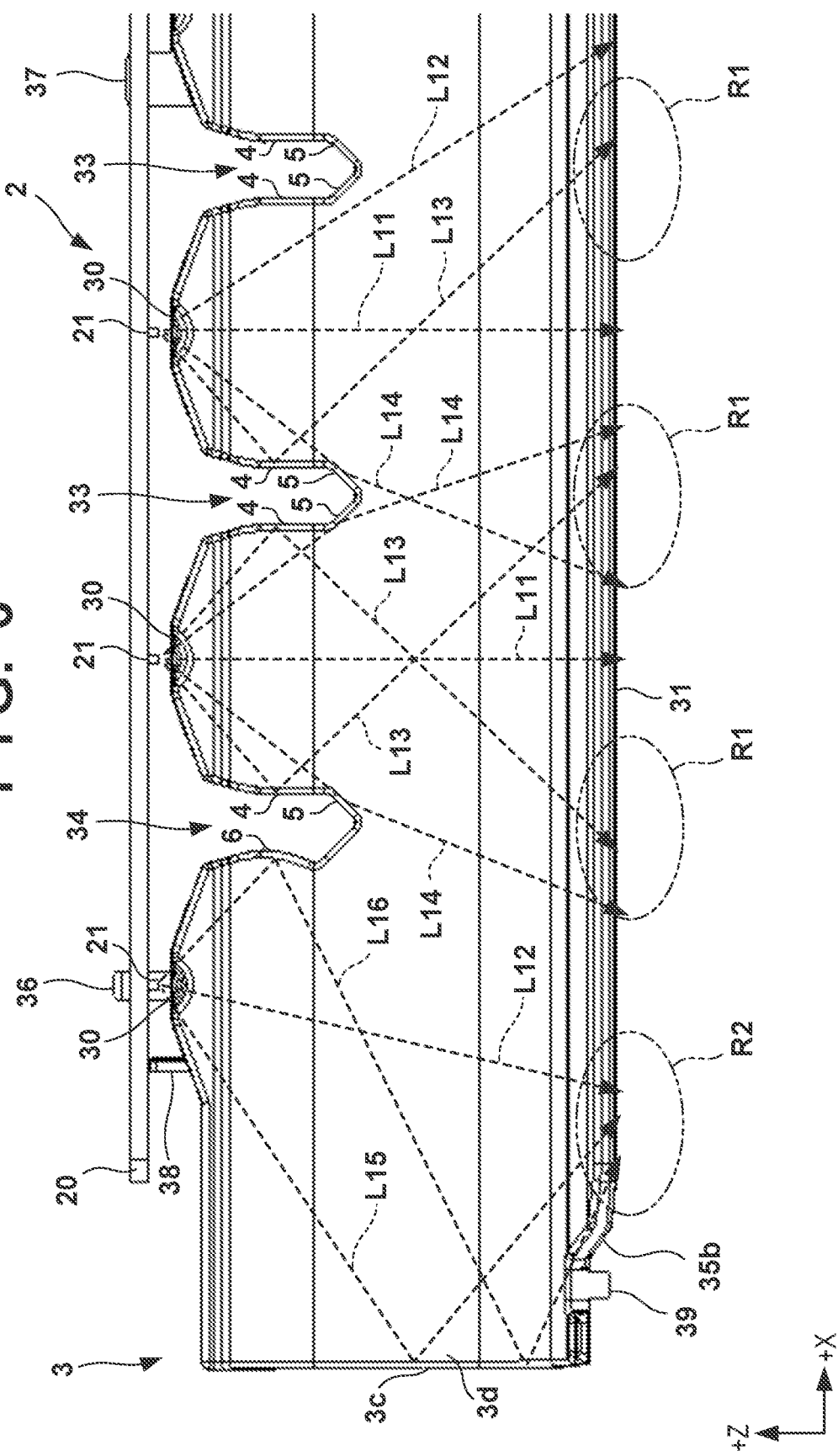
FIG. 6 is a view for explaining a light propagation mode in the light guiding member.

Each of the reflecting surface forming portions 33 and 34 is an opening portion extending through the light guiding portion 32 in its thickness direction, and a notch open on the side of the end portion 3a. The end face of the light guiding member 3 defining the opening portion forms the reflecting surface. FIG. 6 is a view for explaining the reflecting surface.

The reflecting surface forming portion 33 has a symmetric shape in the X direction, and forms a pair of reflecting surfaces 4 and a pair of reflecting surfaces 5. Each of the pair of reflecting surfaces 4 is a flat surface on the Y-Z plane, and they are surfaces spaced apart from each other in the X direction. Each of the pair of reflecting surfaces 5 is a surface formed continuously from the light emitting portion 31 side of one of the pair of reflecting surfaces 4 (from the lower end of the reflecting surface 4) in a direction different from the direction of the pair of reflecting surfaces 4. In this embodiment, the pair of reflecting surfaces 5 are flat surfaces inclined with respect to the Y-Z plane, and particularly, flat surfaces inclined so as to come close to each other from the light receiving portion 30 side toward the light emitting portion 31 side. Each of the pair of reflecting surfaces 4 and the pair of reflecting surfaces 5 may be not a flat surface but a curved surface.

The reflecting surface forming portion 34 has an asymmetric shape in the X direction. The reflecting surfaces 4 and 5 having the same specifications as the reflecting surfaces 4 and 5 of the reflecting surface forming portion 33 are formed on the inner side of the reflecting surface forming portion 34 in the X direction, but a reflecting surface 6 is formed on the outer side in the X direction. The reflecting surface 6 is a curved surface convex toward the inner side in the X direction. The reflecting surface 6 may be a flat surface.

The luminance unevenness in the light emitting portion 31 will be described. Among the X-direction positions in the light emitting portion 31, a region R1 corresponds to a region between the light receiving portions 30 when viewed in the X direction. Since this is a region far from the light receiving portions 30, the luminance tends to decrease. Therefore, by facilitating reflection to the region R1 using the reflecting surface 4 and the reflecting surface 5, a decrease in luminance in the region R1 is prevented. As illustrated by dashed lines L11 to L16, light entering the light receiving portion 30 is directed in multiple directions. When viewed on the X-Z projection plane as in FIG. 6, the dashed line L11 represents the light traveling straight in the optical axis direction (the direction of the optical axis L0). Due to such light, in the light emitting portion 31, the luminance tends to be high at a position identical to the position of the light receiving portion 30 in the X direction.

As represented by the dashed line L13, the reflecting surface 4 is designed so as to reflect light from the light receiving portion 30 in the direction opposite to the incident direction in the X direction, and to the light emitting portion 31 side, particularly, toward the region R1. With this, a decrease in luminance in the region R1 is prevented. Particularly, the reflecting surface 4 can prevent the light from the light receiving portion 30 from being directed to, among the X-direction positions in the light emitting portion 31, the position corresponding to the adjacent light receiving portion 30, and direct the light to the region R1 at an opposite position, thereby suppressing the luminance unevenness in the light emitting portion 31.

As represented by the dashed line L14, the reflecting surface 5 is designed so as to reflect light from the light receiving portion 30 in the direction same as the incident direction in the X direction but change the directivity direction thereof, and to the light emitting portion 31 side, particularly, toward the region R1. With this, a decrease in luminance in the region R1 is further prevented. The reflecting surface 5 can also prevent the light from the light receiving portion 30 from being directed to, among the X-direction positions in the light emitting portion 31, the position corresponding to the adjacent light receiving portion 30, and direct the light to the region R1, thereby suppressing the luminance unevenness in the light emitting portion 31.

As represented by the dashed line L12, the position of the reflecting surface 4 and the position of the reflecting surface 5 are designed so as not to reflect, by the reflecting surface 4 and the reflecting surface 5, light entering the light receiving portion 30 at a small angle with respect to the optical axis L0. The light represented by the dashed line L12 propagates to the vicinity of an X-direction end portion of the region R1. Therefore, by not changing the directivity direction of the light, the luminance unevenness in the light emitting portion 31 can be suppressed.

Among the X-direction positions in the light emitting portion 31, a region R2 is located in the end portion. It tends to be dark there as well. As represented by the dashed line L15, the side surface 3c reflects light from the light receiving portion 30 in the direction opposite to the incident direction in the X direction, and to the light emitting portion 31 side, particularly, toward the region R2. With this, a decrease in luminance in the region R2 is prevented. Further, as represented by the dashed line L16, the reflecting surface 6 is designed so as to reflect light from the light receiving portion (end-portion light receiving portion) 30 located in the end portion in the direction opposite to the incident direction in the X direction, and to the light emitting portion 31 side, particularly, toward the side surface 3c. The light reflected by the side surface 3c is directed to the region R2, and a decrease in luminance in the region R2 is prevented. Thus, occurrence of the luminance unevenness in the light emitting portion 31 upon turning on all the light emitting elements 21 can be suppressed. The light from the light receiving portion (adjacent light receiving portion) 30 adjacent to the end-portion light receiving portion 30 is reflected to the region R1 by the reflecting surface 4 of the reflecting surface forming portion 34.

FIG. 7 shows an example of the relationship between the incident angle of light with respect to the light receiving portion 30 and the reflecting surfaces 4 and 5. In FIG. 7, the incident angle in the optical axis L0 direction is defined as 0°. Light enters the light receiving portion 30 from the light emitting element 21 at an incident angle between 0° to 69°. The reflecting surfaces 4 and 5 are designed so as to totally reflect incident light, and the reflecting surface 4 and the reflecting surface 5 cross each other at an obtuse angle. The pair of reflecting surfaces 5 are continuous in the end portions on the light emitting portion 31 side.

Light with an incident angle between 0° to 37° propagates to the light emitting portion 31 without being reflected by the reflecting surfaces 4 and 5. The light beams represented by the dashed lines L11 and L12 in FIG. 6 are examples of the light with the incident angle between 0° to 37°. Light with an incident angle about 38° is totally reflected by the reflecting surface 5 and propagates to the light emitting portion 31. The light represented by the dashed line L14 in FIG. 6 is an example of the light with the incident angle of about 38°. Light with an incident angle between 39° to 69° hits the reflecting surface 4 while being refracted by the light receiving portion 30, is totally reflected, and propagates to the light emitting portion 31. The light represented by the dashed line L13 in FIG. 6 is an example of the light with the incident angle between 39° to 69°.

The light totally reflected by the reflecting surface 4 or the reflecting surface 5 is diffused toward the light emitting portion 31, and the diffused light irradiates the region R1. A predetermined region serving as a designed irradiation range is, for example, a region having a width half the pitch of the light emitting elements 21 with the position of the midpoint between the light receiving portions 30 adjacent to each other in the X direction as the center.

As has been described above, this embodiment can suppress the luminance unevenness in the light emitting portion 31. Since the light guiding member 3 has a structure in which light is reflected and diffused by the reflecting surface forming portions 33 and 34, it does not require concave/convex portions for light diffusion. Since no concave/convex portion is included, it is also possible to prevent a deterioration in appearance of the light emitting portion 31 while the light source is turned off. Further, if there is no concave/convex portion for light diffusion, spectral diffraction caused by the concave/convex portion does not occur, and manufacturing is facilitated. Since the light guiding member 3 has a structure in which light is reflected and diffused by the reflecting surface forming portions 33 and 34, it is unnecessary to use, as a material of the light guiding member 3, a material containing a diffusion material. Accordingly, a highly transparent material can be used. Hence, the light transmittance is not impaired, and so a decrease in luminance in the light emitting portion 31 can be further suppressed.

<Cover Member>

Figure 8A:
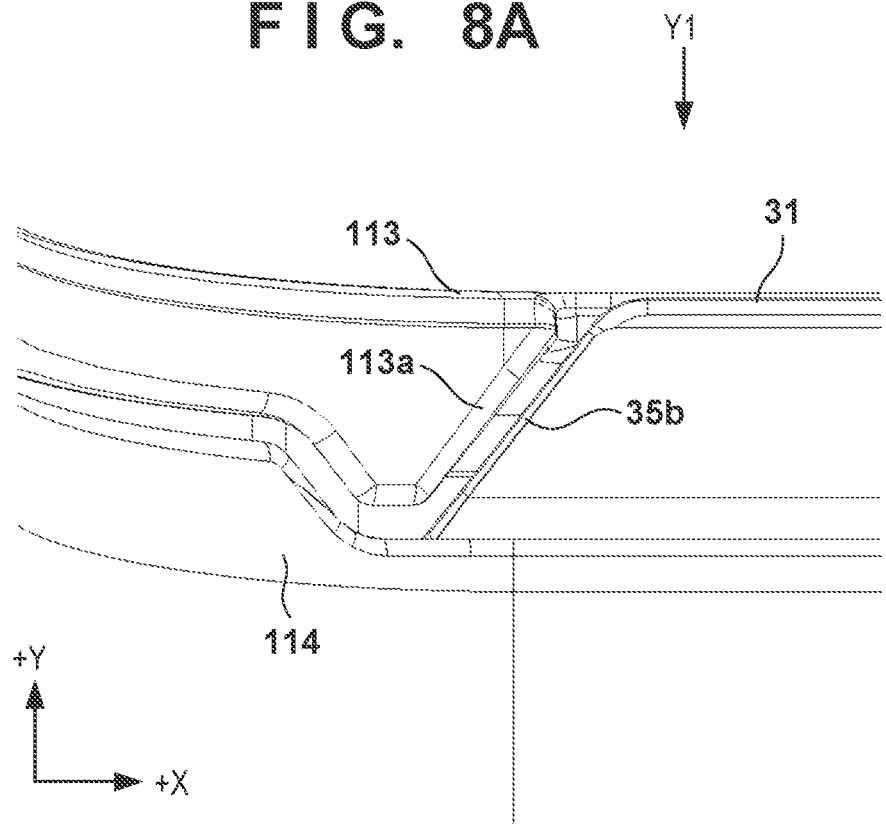
FIG. 8A is a perspective view showing a part of the light guiding member and the structure around the part.

As shown in FIGS. 2 and 5A, in each X-direction end portion 35 of the end portion 3b of the light guiding member 3, a plate-like end side 35a extending forward and the light emitting portion 31 are continuous via an inclined portion 35b. If light is emitted from the inclined portion 35b, when viewing the printing apparatus 100 from the front, the inclined portion 35b may appear brighter than the light emitting portion 31. In this embodiment, by covering the inclined portion 35b with the cover member 113, the inclined portion 35b is prevented from being conspicuous. FIG. 8A is a view showing a periphery of the inclined portion 35b viewed from below. The cover member 113 includes a cover portion 113a that forms the lower surface of the cover member 113 along the inclined portion 35b. When a user views the printing apparatus 100 from the front (visually recognizes it in a Y1 direction), the cover portion 113a hides the inclined portion 35b. Accordingly, when the light emitting portion 31 emits light, the inclined portion 35b can be prevented from being conspicuous.

Second Embodiment

Figure 8B:
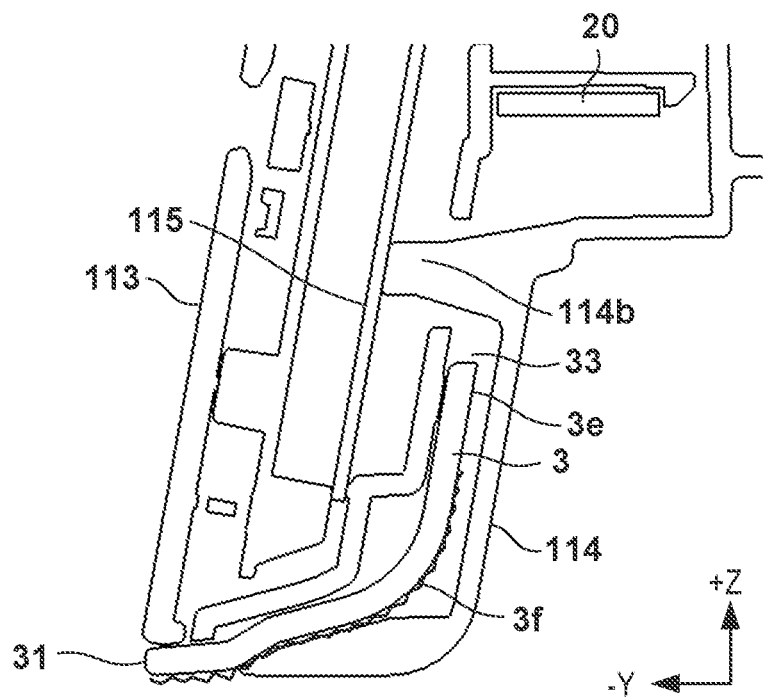
FIG. 8B is a sectional view taken along a line C-C in FIG. 1A.

FIG. 8B is a sectional view showing the positioning structure for a circuit board 115 using the frame 114. This is a sectional view on the Y-Z plane passing through a reflecting surface forming portion 33 corresponding to a sectional view taken along a line C-C in FIG. 1B. The circuit board 115 is a circuit board forming the operation unit 112. The frame 114 includes a support portion 114b protruding in the −Y direction. When the support portion 114b abuts against the back surface of the circuit board 115, the circuit board 115 is positioned in the Y direction. The support portion 114b is configured to pass through the reflecting surface forming portion 33, which is an opening portion, so there is no influence on light guiding of a light guiding member 3 existing between the circuit board 115 and the frame 114.

Further, in the example shown in FIG. 8B, a textured emboss 3f is formed in the lower portion of a rear surface 3e. By forming a diffusion portion like the emboss 3f in a light guiding portion 32, the light diffusibility can be improved, and the luminance unevenness in a light emitting portion 31 can be further suppressed.

Third Embodiment

Each of reflecting surfaces (3c to 3e and 4 to 6) may be formed by a mirror surface. The mirror surface may be formed by mirror processing by polishing or mirror processing by applying mirror paint. This can improve the light reflectance. Light diffusion processing may be performed on each of the reflecting surfaces (3c to 3e and 4 to 6). A diffusion material may be applied as light diffusion processing. By improving the diffusibility of the reflecting surface, suppression of the luminance unevenness is achieved.

Fourth Embodiment

Figure 9A:
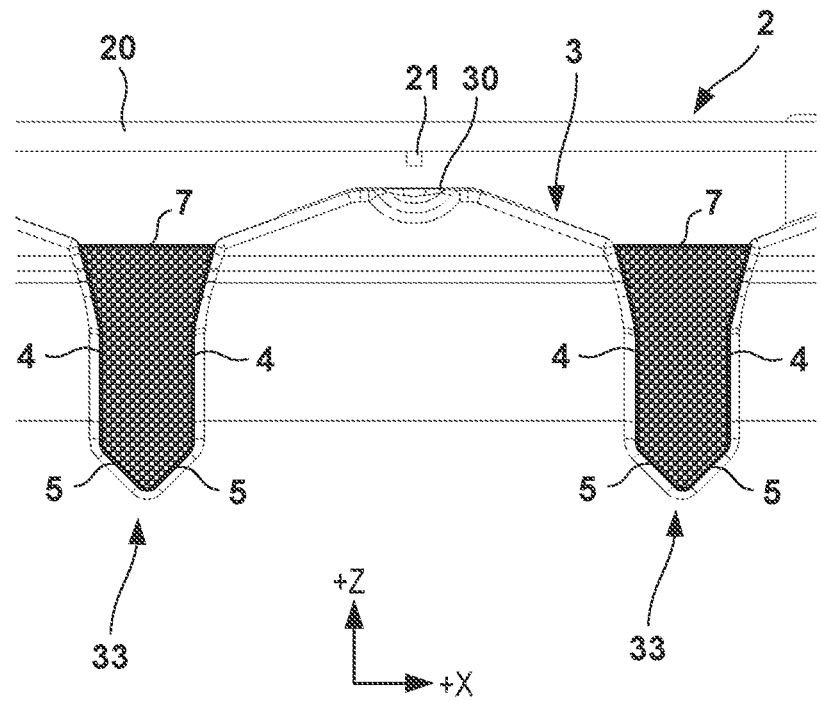
FIGS. 9A and 9B are views for explaining another embodiment.

A light shielding member may be provided in each of reflecting surface forming portions 33 and 34, which are opening portions. This can prevent a leakage of light. FIG. 9A shows an example of this. In the example shown in FIG. 9A, a light shielding member 7 is densely embedded in the reflecting surface forming portion 33. The light shielding member 7 may be a member of a color with a low light reflectance. The light shielding member 7 may be not densely embedded in each of the reflecting surface forming portions 33 and 34, but partially arranged in each of the reflecting surface forming portions 33 and 34. The light shielding member 7 may be hollow.

Figure 9B:
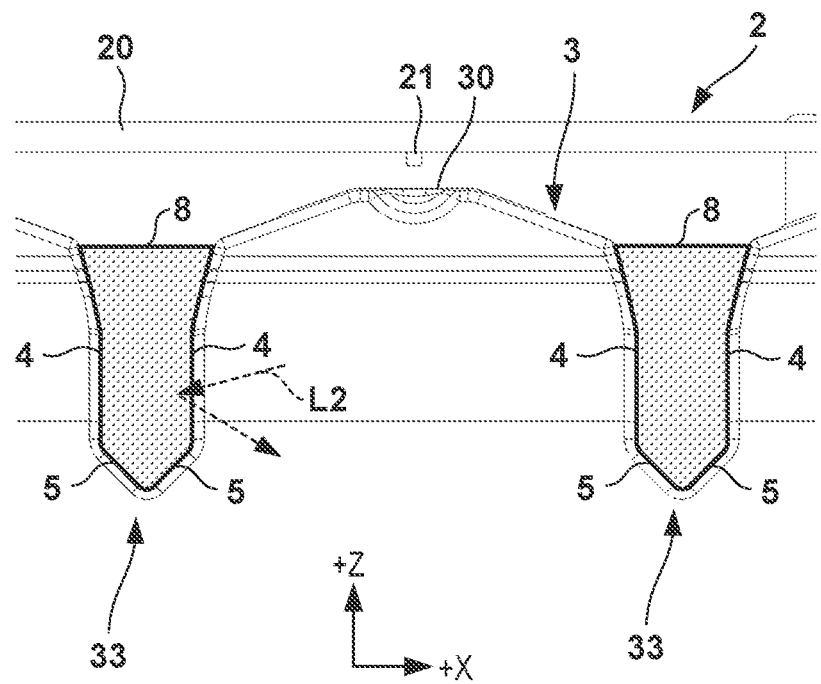

A reflective member may be provided in each of the reflecting surface forming portions 33 and 34, which are opening portions. This can reflect the light exiting to the outside from each of the reflecting surface forming portions 33 and 34, and cause it to reenter a light guiding member 3. FIG. 9B shows an example of this. In the example shown in FIG. 9B, a reflective member 8 is densely embedded in the reflecting surface forming portion 33. The reflective member 8 is a mirror surface member including a mirror surface at least in a surface facing the end face of the reflecting surface forming portion 33. The reflective member 8 may be not densely embedded in each of the reflecting surface forming portions 33 and 34, but partially arranged in each of the reflecting surface forming portions 33 and 34. The reflective member 8 may be hollow.

Fifth Embodiment

The shape of a reflecting surface may be not a flat surface but a curved surface. FIG. 10A shows an example in which the reflecting surface 5 is formed to be a curved surface. In this manner, each reflecting surface may be a curved surface formed to have an appropriate position and curvature so as to distribute incident light to regions R1 and R2 in a light emitting portion 31.

Sixth Embodiment

Each of reflecting surface forming portions 33 and 34, which are opening portions, may be not a notch but an enclosed opening portion (hole). FIG. 10B shows an example of this. In the example shown in FIG. 10B, the reflecting surface forming portion 33 is formed as an enclosed hole extending through a light guiding member 3 in the thickness direction. End faces defining the hole form reflecting surfaces 4 and 5.

Seventh Embodiment

Each of reflecting surface forming portions 33 and 34 may be not an opening portion but a concave portion which is concave in the thickness direction of a light guiding portion 32. This can achieve an improvement in moldability of a light guiding member 3 and stabilization of part dimensions. FIGS. 11A and 11B show an example in which the reflecting surface forming portion 33 is formed as a concave portion. FIG. 11B is a sectional view taken along a line D-D in FIG. 11A. In the example shown in FIGS. 11A and 11B, the reflecting surface forming portion 33 is formed by a part of the light guiding portion 32 which is concave to the side of a rear surface 3e. The end faces of the concave portion form reflecting surfaces 4 and 5.

FIGS. 11C and 11D show another example in which the reflecting surface forming portion 33 is formed as a concave portion. FIG. 11D is a sectional view taken along a line E-E in FIG. 11C. In the example shown in FIGS. 11C and 11D, the reflecting surface forming portion 33 is formed by a part of the light guiding portion 32 which is concave to the side of a front surface 3d. The end faces of the concave portion form the reflecting surfaces 4 and 5.

Other Embodiments

A display device is applicable to a printing apparatus of a type different from an inkjet printing apparatus, and various kinds of apparatuses other than the printing apparatus.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2021-150416, filed Sep. 15, 2021, which is hereby incorporated by reference herein in its entirety.

What is claimed is:

1. A light emitting device comprising:
a first light emitting element;
a second light emitting element arranged spaced apart from the first light emitting element in a first direction; and
a light guiding member including a first light receiving portion configured to receive light from the first light emitting element and a second light receiving portion configured to receive light from the second light emitting element, and configured to emit the light received by the first light receiving portion and the second light receiving portion from a light emitting portion via a light guiding portion,
wherein
the light guiding portion includes a reflecting surface forming portion between the first light receiving portion and the second light receiving portion in the first direction,
the reflecting surface forming portion includes: a first reflecting surface on a side of the first light receiving portion in the first direction; and a second reflecting surface on a side of the second light receiving portion in the first direction,
the first reflecting surface is formed by surfaces having different angles including: a first upper surface that reflects the light from the first light receiving portion to a side of the first light receiving portion in the first direction; and a first lower surface that inclines to a side of the second reflecting surface as the first lower surface approaches the light emitting portion from the first upper surface, and
the second reflecting surface formed by surfaces having different angles including: a second upper surface that reflects the light from a side of the second light receiving portion to the side of the second light receiving portion in the first direction; and a second lower surface that inclines to a side of the first reflecting surface as the second lower surface approaches the light emitting portion from the second upper surface.

2. The device according to claim 1, wherein
each of the first reflecting surface and the second reflecting surface includes a surface orthogonal to the first direction.

3. The device according to claim 1, wherein
the first reflecting surface totally reflects the light from the first light receiving portion, and
the second reflecting surface totally reflects the light from the second light receiving portion.

4. The device according to claim 1, wherein
a light shielding member is provided between the first reflecting surface and the second reflecting surface.

5. The device according to claim 1, further comprising
a third light emitting element arranged spaced apart from the second light emitting element in the first direction,
wherein
the light guiding portion includes a third light receiving portion configured to receive light from the third light emitting element, and a second reflecting surface forming portion between the second light receiving portion and the third light receiving portion in the first direction, and emits the light received by the third light receiving portion from the light emitting portion via the light guiding portion, and
the second reflecting surface forming portion includes: a third reflecting surface on a side of the second light receiving portion in the first direction; and a fourth reflecting surface on a side of the third light receiving portion in the first direction,
the third reflecting surface is formed by surfaces having different angles including: a third upper surface that reflects the light from the second light receiving portion to a side of the second light receiving portion in the first direction; and a third lower surface that inclines to a side of the fourth reflecting surface as the third lower surface approaches the light emitting portion from the third upper surface, and
the fourth reflecting surface is formed by surfaces having different angles including: a fourth upper surface that reflects the light from a side of the third light receiving portion to the side of the third light receiving portion in the first direction; and a fourth lower surface that inclines to a side of the third reflecting surface as the fourth lower surface approaches the light emitting portion from the fourth upper surface.

6. The device according to claim 1, further comprising
a cover member configured to expose the light emitting portion and cover the light guiding member,
wherein
the light guiding member includes a first end portion and a second end portion spaced apart from each other in a second direction orthogonal to the first direction,
the first end portion includes the first light receiving portion and the second light receiving portion,
the second end portion includes a third end portion and a fourth end portion spaced apart from each other in the first direction, and the light emitting portion between the third end portion and the fourth end portion,
each of the third end portion and the fourth end portion includes an inclined portion continuous with the light emitting portion, and
the cover member includes a portion extending along the inclined portion and covering the inclined portion.

7. The device according to claim 1, further comprising
a board on which the first light emitting element and the second light emitting element are mounted, wherein the light guiding member includes an engagement portion configured to engage with the board.

8. The device according to claim 7, wherein the engagement portion includes a plurality of abutment portions spaced apart from each other in the first direction and configured to abut against the board in a direction parallel to an optical axis direction of the first light emitting element.

9. The device according to claim 7, wherein the engagement portion includes a pair of holding portions arranged spaced apart from each other in a second direction orthogonal to the first direction so as to sandwich the board.

10. The device according to claim 1, wherein the light guiding member includes a first portion on a first optical axis of the first light emitting element, and a second portion on a second optical axis of the second light emitting element,
a cross sectional area of the first portion orthogonal to the first optical axis increases as a position of the cross sectional area in a direction of the first optical axis approaches the first light emitting element, and
a cross sectional area of the second portion orthogonal to the second optical axis increases as a position of the cross sectional area in a direction of the second optical axis approaches the second light emitting element.

11. The device according to claim 1, wherein the light guiding portion includes a diffusion portion configured to diffuse light.

12. The device according to claim 1, further comprising a frame,
wherein the light guiding member includes, on each side of the light emitting portion, an abutment portion configured to abut against the frame.

13. The device according to claim 7, wherein the engagement portion includes a protruding portion inserted into an opening portion provided in the board.

14. The device according to claim 1, wherein the reflecting surface forming portion is an opening portion extending through the light guiding portion in a thickness direction, and
the surface included in the first reflecting surface and the surface included in the second reflecting surface form a pair of end faces of the opening portion.

15. The device according to claim 1, wherein the light guiding member includes a plurality of light receiving portions including the first light receiving portion and the second light receiving portion and arrayed in the first direction so as to correspond to a plurality of light emitting elements arranged in a row, and
the light emitting portion is continuously formed parallel to an array direction of the plurality of light receiving portions.

16. The device according to claim 5, wherein the second reflecting surface and the third reflecting surface face each other,
the second reflecting surface reflects at least part of the light from the second light receiving portion to a region in the light emitting portion located between the second light receiving portion and the third light receiving portion in the first direction, and
the third reflecting surface reflects at least part of the light from the second light receiving portion to a region in the light emitting portion located between the first light receiving portion and the second light receiving portion in the first direction.

17. A light guiding member comprising:
a first light receiving portion;
a second light receiving portion arranged spaced apart from the first light receiving portion in a first direction;
a light emitting portion configured to emit light received by the first light receiving portion and the second light receiving portion; and
a light guiding portion located between the first light receiving portion and the second light receiving portion and the light emitting portion,
wherein
the light guiding portion includes a reflecting surface forming portion between the first light receiving portion and the second light receiving portion in the first direction,
the reflecting surface forming portion includes: a first reflecting surface on a side of the first light receiving portion in the first direction; and a second reflecting surface on a side of the second light receiving portion in the first direction,
the first reflecting surface is formed by surfaces having different angles including: a first upper surface that reflects the light from the first light receiving portion to a side of the first light receiving portion in the first direction; and a first lower surface that inclines to a side of the second reflecting surface as the first lower surface approaches the light emitting portion from the first upper surface, and
the second reflecting surface formed by surfaces having different angles including: a second upper surface that reflects the light from the second light receiving portion to a side of the second light receiving portion in the first direction; and a second lower surface that inclines to a side of the first reflecting surface as the second lower surface approaches the light emitting portion from the second upper surface.

18. The light guiding member according to claim 17, wherein
each of the first reflecting surface and the second reflecting surface includes a surface orthogonal to the first direction.

19. The light guiding member according to claim 17, wherein
the first reflecting surface totally reflects the light from the first light receiving portion, and
the second reflecting surface totally reflects the light from the second light receiving portion.

20. The light guiding member according to claim 17, wherein
a light shielding member is provided between the first reflecting surface and the second reflecting surface.

21. The light guiding member according to claim 17, wherein
the light guiding portion includes a third light receiving portion arranged spaced apart from the second light receiving portion in the first direction, and a second reflecting surface forming portion between the second light receiving portion and the third light receiving portion in the first direction, and emits the light received by the third light receiving portion from the light emitting portion via the light guiding portion, and
the second reflecting surface forming portion includes: a third reflecting surface on a side of the second light receiving portion in the first direction; and a fourth reflecting surface on a side of the third light receiving portion in the first direction, the third reflecting surface is formed by surfaces having different angles including: a third upper surface that reflects the light from the second light receiving portion to a side of the second light receiving portion in the first direction; and a third lower surface that inclines to a side of the fourth reflecting surface as the third lower surface approaches the light emitting portion from the third upper surface, and the fourth reflecting surface is formed by surfaces having different angles including: a fourth upper surface that reflects the light from a side of the third light receiving portion to the side of the third light receiving portion in the first direction; and a fourth lower surface that inclines to a side of the third reflecting surface as the fourth lower surface approaches the light emitting portion from the fourth upper surface.

\* \* \* \* \*